United States Patent
Suzuki

[11] Patent Number: 6,010,755
[45] Date of Patent: *Jan. 4, 2000

[54] METHOD AND APPARATUS FOR FORMING THIN FILMS USING DUAL ECR PLASMA GENERATORS

[75] Inventor: Masayasu Suzuki, Kanagawa, Japan

[73] Assignee: Shimadzu Corporation, Kyoto, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/869,200

[22] Filed: Jun. 4, 1997

[30] Foreign Application Priority Data

| Jun. 6, 1996 | [JP] | Japan | 8-144384 |
| Oct. 25, 1996 | [JP] | Japan | 8-283897 |

[51] Int. Cl.[7] .............. H05H 1/02; H05H 1/30; C23C 16/00; H01J 7/24
[52] U.S. Cl. ............. 427/571; 427/575; 118/723 MW; 118/723 MA; 315/111.41
[58] Field of Search ............. 204/298.38, 298.39, 204/298.16, 298.17, 298.19, 298.26, 192.12, 298.01, 192.1, 192.32; 427/585, 575, 595, 571, 596, 579; 118/723 MR, 723 MA, 723 MW, 723 R; 156/345; 315/111.41, 111.21

[56] References Cited

U.S. PATENT DOCUMENTS

| 4,450,031 | 5/1984 | Ono et al. ............. 156/345 |
| 4,521,447 | 6/1985 | Ovshinsky et al. ............. 427/585 |
| 4,952,273 | 8/1990 | Popov ............. 204/298.38 |
| 4,990,229 | 2/1991 | Campbell et al. ............. 204/298.16 |
| 5,006,219 | 4/1991 | Latz et al. ............. 204/298.16 |
| 5,063,329 | 11/1991 | Okamoto ............. 315/111.21 |
| 5,081,398 | 1/1992 | Asmussen et al. ............. 315/111.41 |
| 5,122,252 | 6/1992 | Latz et al. ............. 204/298.26 |
| 5,182,495 | 1/1993 | Fukuda et al. ............. 204/298.38 |
| 5,208,512 | 5/1993 | Forster et al. ............. 204/298.38 |
| 5,211,995 | 5/1993 | Kuehnle et al. ............. 427/579 |
| 5,282,899 | 2/1994 | Balmashnov et al. ............. 204/298.38 |
| 5,306,379 | 4/1994 | Kamide ............. 204/298.38 |
| 5,487,785 | 1/1996 | Horiike et al. ............. 118/723 MR |
| 5,584,973 | 12/1996 | Wada et al. ............. 204/192.12 |

*Primary Examiner*—Nam Nguyen
*Assistant Examiner*—Gregg Cantelmo
*Attorney, Agent, or Firm*—Majestic, Parsons, Siebert & Hsue P.C.

[57] ABSTRACT

An apparatus for forming thin films such as protective layers on both surfaces of a substrate of a magnetic memory device has an evacuable reaction chamber sandwiched between two electron cyclotron resonance plasma generators disposed on mutually opposite sides. Each plasma generator includes a wave guide for introducing microwave energy and a magnetic coil for providing a magnetic field for generating a plasma and causing the generated plasma to move to the substrate set inside the reaction chamber with a negative bias voltage applied thereto.

11 Claims, 2 Drawing Sheets

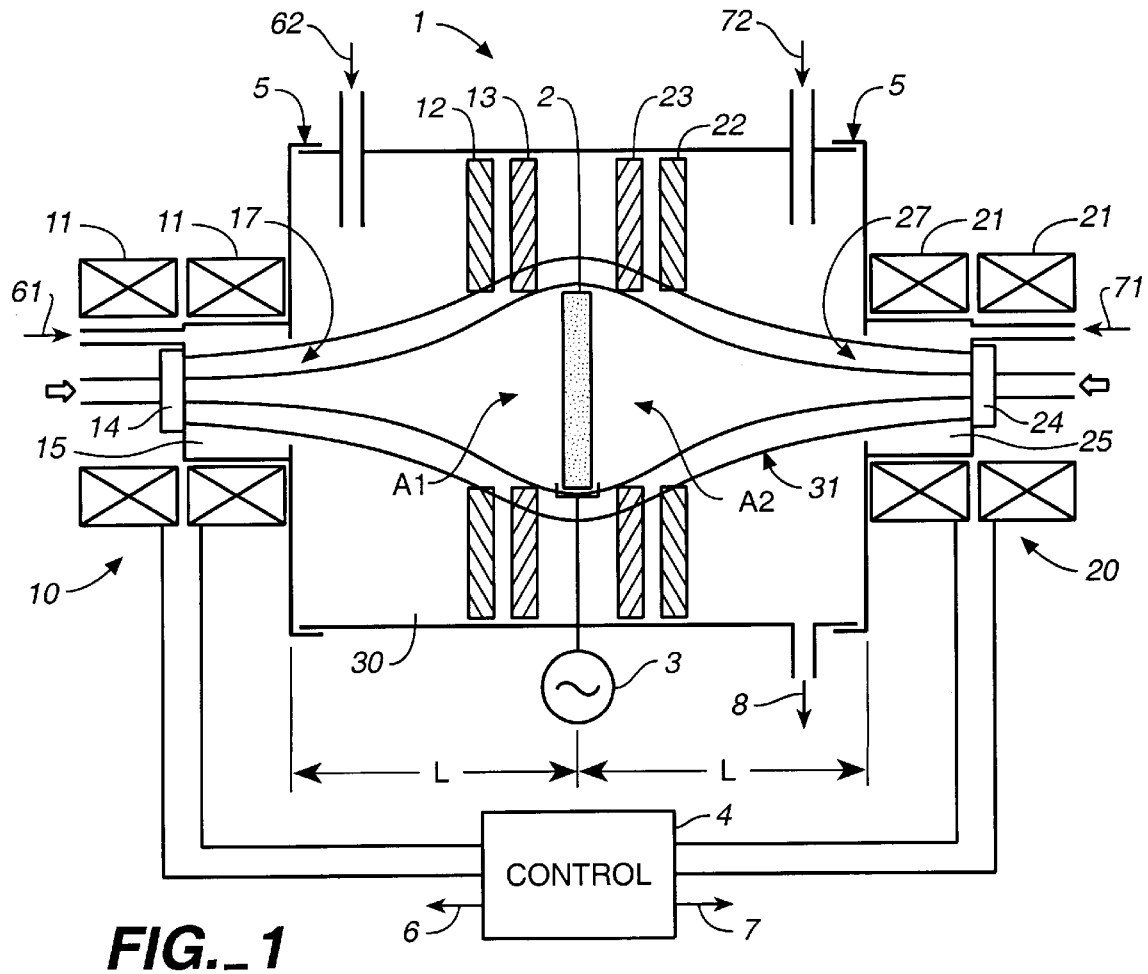
FIG._1
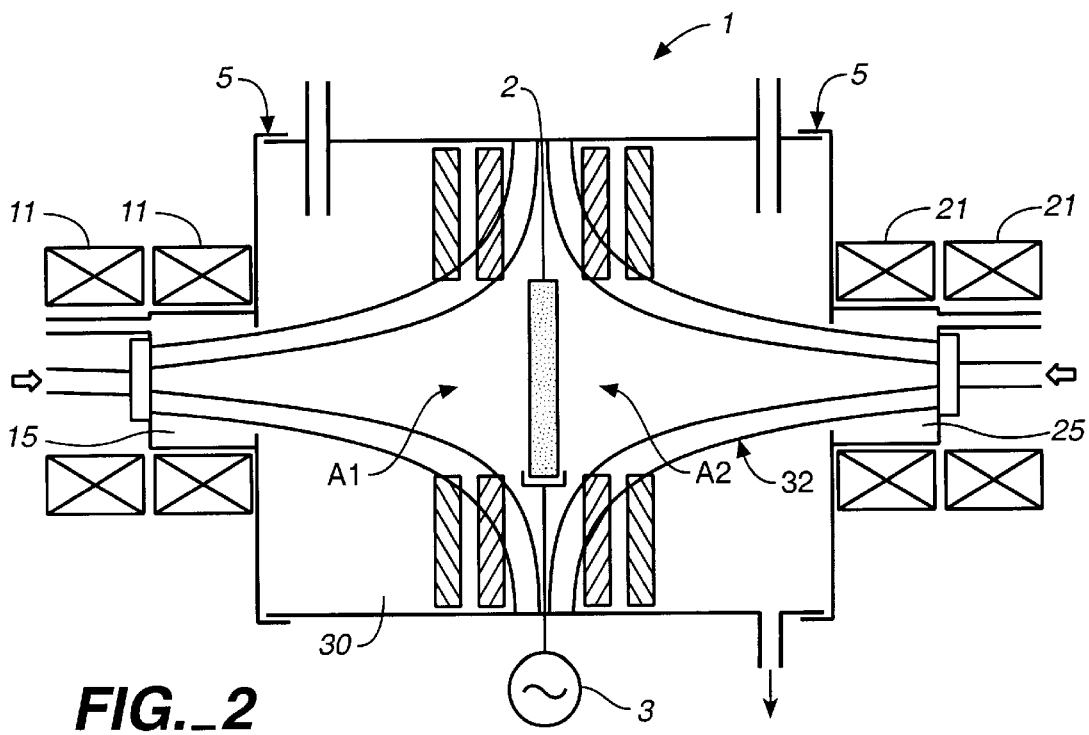
FIG._2

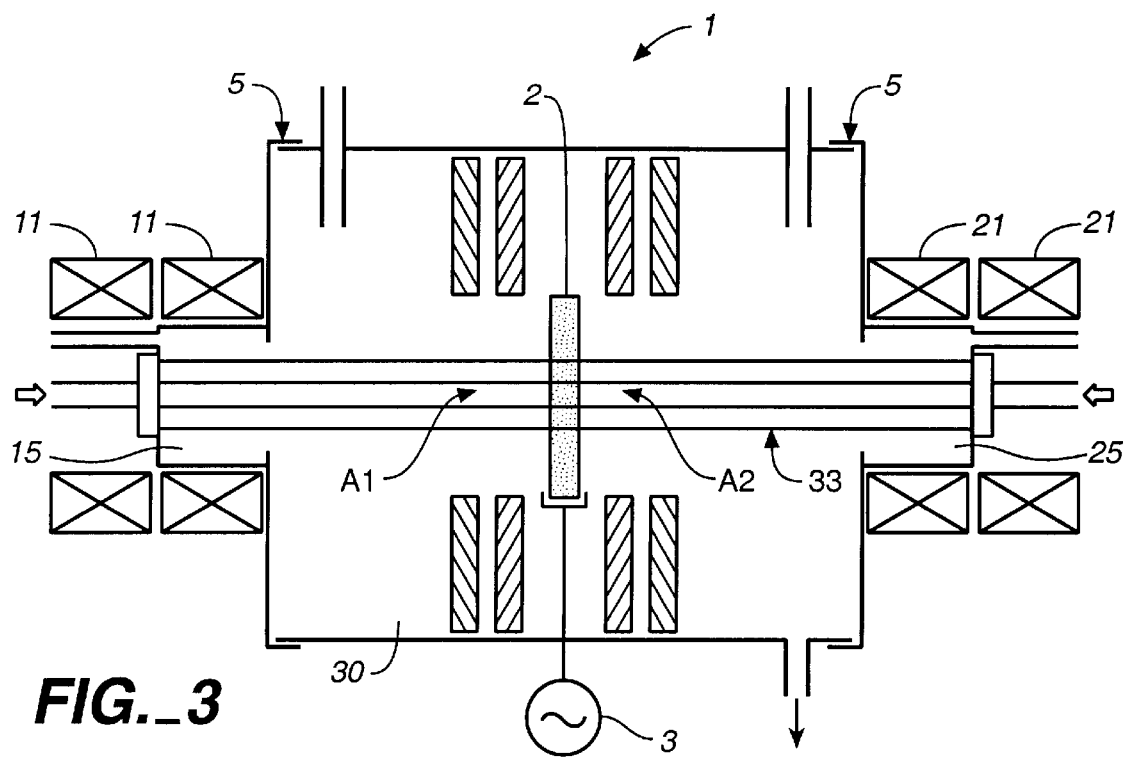
FIG._3
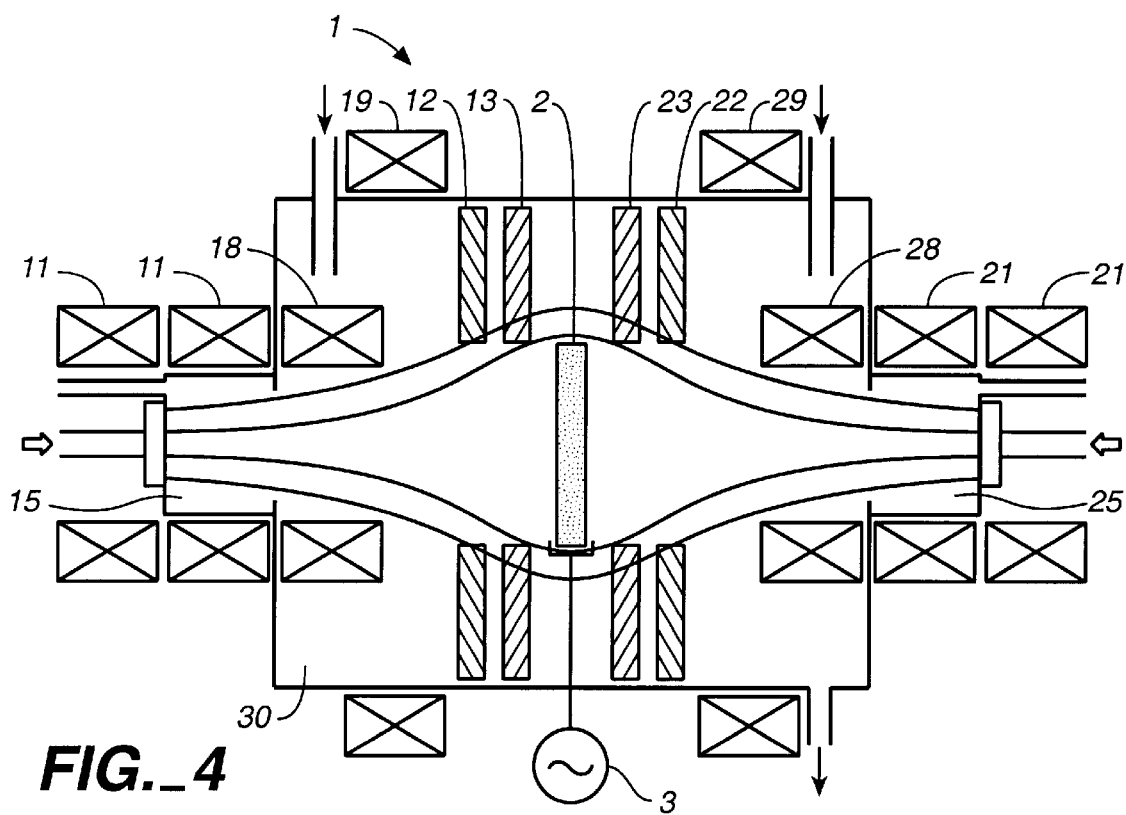
FIG._4

METHOD AND APPARATUS FOR FORMING THIN FILMS USING DUAL ECR PLASMA GENERATORS

BACKGROUND OF THE INVENTION

This invention relates to an apparatus for forming thin films and more particularly to such an apparatus for forming protective thin film layers.

In general, a magnetic memory device is produced by first forming a magnetic layer on a substrate for storing data and then forming a protective layer on the magnetic layer for protecting the magnetic layer from the external environment.

For forming protective layers for a magnetic memory device having magnetic layers on both surfaces, it has been known to use an apparatus for forming thin films by sputtering and to form protective layers at the same time on both surfaces of the substrate with magnetic layers formed thereon.

When data are written on or read from such a magnetic memory device, a magnetic head is positioned opposite to its magnetic layer with a protective layer in between. Since the read/write characteristic of a magnetic head depends on the distance separating it from the magnetic layer, it is necessary to reduce this distance as much as possible in order to improve the magnetic recording characteristic of a magnetic recording system. It is for this reason that there is an increasing demand for thinner protective films.

Protective films produced by conventional sputtering methods have problems in that their characteristics such as resistance against voltage, resistance against corrosion and resistance against wears deteriorate if the thickness is less than about 10 nm, or about 12.5 nm as a practical matter, and hence that the film can no longer fully serve as a protective layer.

SUMMARY OF THE INVENTION

It is therefore an object of this invention to provide an improved apparatus for forming thin films which can solve these problems of prior art apparatus, being capable of forming on both surfaces of a substrate protective films with superior characteristics even if their thickness is less than 12.5 nm.

An apparatus for forming thin films embodying this invention, with which the above and other objects can be satisfied, may be characterized as comprising an evacuable reaction chamber and two electron cyclotron resonance (ECR) plasma generating mechanisms disposed on its mutually opposite sides. Each plasma generating mechanism includes a wave guide for introducing microwaves and a magnetic field coil for providing a magnetic field necessary for generating plasma and causing the generated plasma to move to the substrate set inside the reaction chamber. Control coils may be additionally provided either inside or outside the reaction chamber for controlling the shape of the divergent magnetic field inside the reaction chamber, as well as a control unit for controlling the operation of such control coils. The magnetic field coils serve not only to establish ECR conditions but also to form a high-density ion flux near the substrate for the formation of a thin film by a chemical vapor deposition method. The distance between the two plasma generating mechanisms may be made variable for adjusting the magnetic field inside the reaction chamber.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a schematic block diagram of an apparatus embodying this invention for forming thin films;

FIG. 2 is a schematic diagram of a magnetic field which is excessively divergent inside the apparatus of FIG. 1;

FIG. 3 is a schematic diagram of a magnetic field which is not divergent inside the apparatus of FIG. 1; and FIG. 4 is a schematic block diagram of another apparatus embodying this invention.

Throughout herein, those components which can be substantially identical or equivalent are indicated by the same numerals for convenience even where they are components of different apparatus and may not necessarily be explained repetitively.

DETAILED DESCRIPTION OF THE INVENTION

The invention is described next by way of an example with reference to FIG. 1 which schematically shows the structure of an apparatus 1 embodying this invention, comprising two (first and second) ECR plasma generators 10 and 20 disposed in a face-to-face relationship with respect to each other and opposite to each other with reference to an evacuable reaction chamber 30 which contains a mechanism (not shown) for supporting a sample such as a substrate 2. Since the two ECR plasma generators 10 and 20 are identically structured, only the structure of the first plasma generator 10 will be described below. Components of the second plasma generator 20 will be indicated by two-digit numerals with the same numeral in the lower digit as the corresponding components of the first plasma generator 10 and will not be repetitively explained.

With reference still to FIG. 1, the first ECR plasma generator 10 comprises a wave guide 14 at one end part of a plasma-generating chamber 15 (serving as an ion gun) which is connected to and opens through a window 17 to the reaction chamber 30, and a magnetic field coil 11 outside the plasma-generating chamber 15. The intensity of the magnetic field generated by the magnetic field coil 11 is controlled by a control signal from a control unit 4 such that the ECR conditions and the distribution of a divergent magnetic field 31, formed inside the reaction chamber 30 between and connecting the two ECR plasma generators 10 and 20, can be adjusted.

A reaction gas such as $C_3H_8$, $C_2H_2$ and $CH_4$ is introduced from an external source into the reaction chamber 30 through either or both of the inlets 62 and 72. Microwave energy of frequency 2.54 GHz is introduced through the wave guide 14 to cause a microwave discharge inside the plasma-generating chamber 15. A magnetic flux density of 875 G for establishing an ECR condition is generated by the magnetic field by the magnetic field coil 11 to cause an electron cyclotron resonance and to thereby generate an active ECR plasma. The ECR plasma thus generated inside the plasma-generating chamber 15 is moved towards the substrate 2 along the divergent magnetic field 31 through the window 17, which also serves to focus the plasma particles and to control the plasma potential density and distribution. The kinds, the flow rates and the ratio of the gases introduced through the inlets 62 and 72 can be controlled by gas control means of any known kind symbolically indicated by numerals 6 and 7. High frequency power is supplied to the substrate 2 from a high frequency power source 3 through its support mechanism (not shown). This high frequency power source 3 may be replaced by a DC source or a DC pulse source.

Sandwiching the substrate 2 from both sides inside the reaction chamber 30, there are insulator plates 13 and 23 which are close to the substrate 2, and shielding plates 12 and 22 which sandwich therebetween the insulator plates 13 and 23 for preventing the formation of films anywhere other than the substrate 2 and any discharge between the shielding plates 12 and 22 and the substrate 2. The interior of the reaction chamber 30 may be considered to be divided roughly into two reaction regions by these insulator plates 13 and 23 and the shielding plates 12 and 22, and is connected to an exhaust pump 8 for discharging the gas.

The distance between the two ECR plasma generators 10 and 20 can be adjusted by means of an adjustment mechanism 5 which also serves to adjust the shape of the divergent magnetic field 31 inside the reaction chamber 30, as well as the density of ion flux and the density distribution near the substrate 2. This adjustment mechanism 5 may comprise, for example, means for making portions of the reaction chamber 30 slidable in the axial direction of the divergent magnetic field 31 such that the distance indicated by letter L in FIG. 1 can be adjustably varied. With the two ECR plasma generators 10 and 20 thus disposed opposite to each other in a face-to-face relationship, the divergent magnetic field 31 formed inside the reaction chamber 30 can be formed as a mirror-symmetric field such that the discharge can be stabilized, the ion flux density distribution can be made uniform near the substrate 2 and the distribution of film thickness formed on both surfaces of the substrate 2 can also be made uniform.

The apparatus 1 described above may be operated as below, for example, by introducing high-frequency waves of 2.45 GHz from the two ECR plasma generators 10 and 20 into the two plasma-generating chambers 15 and 25 through the wave guides 14 and 24. The magnetic field coils 11 and 21 are excited to form a magnetic flux density of 875 G to establish an ECR condition and to generate an active ECR plasma by electron cyclotron resonance, while the magnetic field coils 11 and 21 are adjusted to form a divergent mirror-symmetric magnetic field 31 inside the reaction chamber 30.

The plasma particles generated inside the plasma-generating chambers 15 and 25 are drawn out into the reaction chamber 30 along the divergent magnetic field 31 and form an ion flux of a uniform density in the regions (indicated by symbols A1 and A2) near the substrate 2. The ionized reaction gas forms a thin film on the substrate 2 by the negative bias voltage from the power source 3.

Formation of a film can be carried out either on only one surface at a time or on both surfaces at the same time. In either situation, the two magnetic field coils 11 and 12 are activated at the same time to form a divergent mirror-symmetric magnetic field 31 with respect to the substrate 2. When only one surface of the substrate 2 is going to be coated, microwave energy is introduced only into one of the plasma-generating chambers 15 and 25 first and then only into the other. When both surfaces of the substrate 2 are to be coated at the same time, microwave energy is introduced by both of the plasma generators 10 and 20. Introduction of a reaction gas through either or both of the inlets 62 and 72 can be controlled independently by the control unit 4.

Adjustment of the divergent mirror-symmetric magnetic field 31 will be described next. Since the ion flux density and the density distribution in the regions A1 and A2 near the substrate 2 are affected by the shape of the divergent magnetic field 31, the divergent magnetic field 31 must be carefully adjusted to obtain a uniform ion flux and density distribution in order to obtain films of a superior quality.

FIG. 2 shows a situation where the divergent magnetic field 32 is excessively divergent. With the magnetic field 32 diverging thus, the ion flux density distribution is not uniform in the regions A1 and A2 near the substrate 2 and a film with uniform thickness cannot be obtained. FIG. 3 shows another situation where the magnetic field 33 is not divergent. In such a situation, the absorption of the microwaves is not stable, again affecting the uniformity of the ion flux density distribution in the regions A1 and A2.

One of the methods of adjusting the divergent magnetic field 31 is to adjust the first and second magnetic field coils 11 and 21 from the control unit 4, that is, the currents applied to these coils 11 and 21 are controlled while the ECR conditions inside the plasma-generating chambers 15 and 25 remain satisfied. Another method for the adjustment is to adjust the distance between the ECR plasma generators 10 and 20 by means of the adjustment mechanism 5 so as to adjust the shape of the divergent magnetic field generated between them. FIG. 4 shows another apparatus embodying this invention for forming thin films using a third method of adjusting its divergent magnetic field, characterized as further comprising first control coils 18 and 19 and second control coils 28 and 29. Control is effected by adjusting the currents applied to these control coils 18, 19, 28 and 29. In the second and third methods of adjustment described above, the first magnetic field coils 11 and 21 are used primarily for establishing an ECR condition inside the plasma-generating chambers 15 and 25. The first and second control coils 18, 19, 28 and 29 are primarily for the adjustment of the divergent magnetic field.

Many modifications and variations are possible on the disclosure presented above within the scope of this invention. The control coils 18, 19, 28 and 29 may be placed either inside or outside the reaction chamber 30. Adjustments of the magnetic field coils 11 and 21, the distance between the ECR plasma generators 10 and 20, and the control coils 18, 19, 28 and 29 can be carried out individually, depending on the shape and dimensions of the apparatus. After these adjustments are done, it is usually possible to maintain the divergent magnetic field 31 in a desired shape by fixing the length L and the currents supplied to the coils. Some of the coils may also be substituted by permanent magnets.

It has been ascertained that protective films formed on both surfaces of a substrate by a method according to this invention have superior characteristics such as resistance against voltage and corrosion, as well as wear resistance even if the thickness is less than 10 nm, or 12.5 nm as a practical matter, compared to films formed by conventional sputtering methods.

What is claimed is:

1. An apparatus for forming thin films on mutually oppositely facing surfaces of a substrate, said apparatus comprising:

an evacuable reaction chamber containing said substrate;

two electron cyclotron resonance (ECR) plasma generators disposed in a face-to-face relationship with each other and each in a face-to-face relationship with a corresponding one of said surfaces of said substrate on mutually opposite sides of said reaction chamber, said ECR plasma generators each including means for introducing microwave energy into said reaction chamber and magnetic field coils for providing a magnetic field inside said reaction chamber; and a control unit for controlling said magnetic field coils to establish a mirror-symmetric divergent magnetic field inside said reaction chamber between and connecting said two ECR plasma generators.

2. The apparatus of claim 1 further comprising a power source for applying a biasing voltage to said substrate.

3. The apparatus of claim 1 wherein each of said ECR plasma generators further includes means for introducing a reaction gas into said reaction chamber.

4. The apparatus of claim 1 further comprising means for adjustably changing the length of said reaction chamber.

5. The apparatus of claim 1 further comprising control coils for forming a magnetic field of a specified shape inside said reaction chamber.

6. The apparatus of claim 1 further comprising control coils for forming a magnetic field of a specified shape inside said reaction chamber, said control unit serving also to control said control coils.

7. The apparatus of claim 1 further comprising:

shielding plates disposed between said substrate and said ECR plasma generators for preventing formation of thin films anywhere other than said substrate; and insulating plates disposed between said substrate and said shielding plates for preventing discharge therebetween.

8. An electron cyclotron resonance method of forming thin films on mutually oppositely facing surfaces of a substrate, said method comprising the steps of:

setting said substrate inside an evacuable reaction chamber and applying a biasing potential to said substrate;

providing two ECR plasma generators in a face-to-face relationship with respect to each other and each in a face-to-face relationship with a corresponding one of said surfaces of said substrate on mutually opposite sides of said chamber;

generating plasmas by said two ECR plasma generators;

providing a mirror-symmetric divergent magnetic field inside said reaction chamber between and connecting said two ECR plasma generators; and controlling said magnetic field to generate a uniform ion flux near said target.

9. The method of claim 8, further comprising the step of varying the distance between said two ECR plasma generators to thereby adjust said divergent magnetic field.

10. The method of claim 8, wherein said ECR plasma generators generate said plasmas at a same time.

11. The method of claim 8, wherein said ECR plasma generators generate said plasmas one at a time.

* * * * *